United States Patent
Chong et al.

(10) Patent No.: US 11,552,226 B2
(45) Date of Patent: Jan. 10, 2023

(54) METHOD FOR PRODUCING AN OPTOELECTRONIC DEVICE

(71) Applicant: OSRAM Opto Semiconductors GmbH, Regensburg (DE)

(72) Inventors: Chui Wai Chong, Bayan Lepas (MY); Seong Tak Koay, Georgetown (MY); Geok Ling Adelene Ng, Bayan Lepas (MY); Teng Hai Ocean Chuah, Bukit Mertajam (MY)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 97 days.

(21) Appl. No.: 16/980,109

(22) PCT Filed: Mar. 23, 2018

(86) PCT No.: PCT/EP2018/057412
§ 371 (c)(1),
(2) Date: Sep. 11, 2020

(87) PCT Pub. No.: WO2019/179630
PCT Pub. Date: Sep. 26, 2019

(65) Prior Publication Data
US 2021/0028335 A1 Jan. 28, 2021

(51) Int. Cl.
*H01L 33/54* (2010.01)
*H01L 33/00* (2010.01)
(Continued)

(52) U.S. Cl.
CPC .......... *H01L 33/54* (2013.01); *H01L 33/0095* (2013.01); *H01L 33/50* (2013.01);
(Continued)

(58) Field of Classification Search
CPC ............. H01L 33/50; H01L 2933/0041; H01L 2933/005; H01L 2933/0058
See application file for complete search history.

(56) References Cited

U.S. PATENT DOCUMENTS

| 9,366,395 B2 | 6/2016 | Petersen et al. | |
| 2012/0094406 A1* | 4/2012 | Patel | H01L 33/505 257/E33.061 |

(Continued)

FOREIGN PATENT DOCUMENTS

WO 2018036618 A1 3/2018

*Primary Examiner* — Jay C Chang
*Assistant Examiner* — Mikka Liu
(74) *Attorney, Agent, or Firm* — Slater Matsil, LLP

(57) ABSTRACT

An optoelectronic device and a method for producing an optoelectronic device are disclosed. In an embodiment a method includes arranging an optoelectronic semiconductor chip with its top side towards a surface of a carrier, forming a recess at the surface of the carrier such that the recess surrounds the optoelectronic semiconductor chip, arranging a mold compound in the recess and above the surface of the carrier such that the optoelectronic semiconductor chip is embedded into the mold compound, wherein a bottom side of the optoelectronic semiconductor chip remains at least partially not covered by the mold compound, removing the carrier and arranging a wavelength-converting material above the surface of the carrier before arranging the optoelectronic semiconductor chip, wherein the wavelength-converting material is perforated while forming the recess.

8 Claims, 4 Drawing Sheets

(51) Int. Cl.
  *H01L 33/50*    (2010.01)
  *H01L 33/58*    (2010.01)
  *H01L 33/60*    (2010.01)

(52) U.S. Cl.
  CPC .............. *H01L 33/58* (2013.01); *H01L 33/60* (2013.01); *H01L 2933/005* (2013.01); *H01L 2933/0041* (2013.01); *H01L 2933/0058* (2013.01)

(56) References Cited

U.S. PATENT DOCUMENTS

| | | | |
|---|---|---|---|
| 2015/0311405 A1* | 10/2015 | Oyamada | H01L 33/36 438/27 |
| 2016/0005936 A1 | 1/2016 | Illek et al. | |
| 2016/0181483 A1* | 6/2016 | Eichenberg | H01L 33/505 257/89 |
| 2016/0181491 A1 | 6/2016 | Sabathil et al. | |

* cited by examiner

METHOD FOR PRODUCING AN OPTOELECTRONIC DEVICE

This patent application is a national phase filing under section 371 of PCT/EP2018/057412 filed Mar. 23, 2018, which is incorporated herein by reference in its entirety.

TECHNICAL FIELD

The present invention relates to an optoelectronic device and a method for producing an optoelectronic device.

BACKGROUND

From the state of art, it is known to embed optoelectronic semiconductor chips into a mold compound. Furthermore, chip-scale packages (CSP) for optoelectronic semiconductor chips are known.

SUMMARY OF THE INVENTION

Embodiments provide an optoelectronic device based on a chip-scale package and a reflector concept and a method for producing the optoelectronic device.

A method for producing an optoelectronic device comprises the following steps: An optoelectronic semiconductor chip comprising a top side and a bottom side is provided. The optoelectronic semiconductor chip is arranged with its top side towards a surface of a carrier. A recess is formed at the surface of the carrier such that the recess surrounds the optoelectronic semiconductor chip. A mold compound is arranged in the recess and above the surface of the carrier such that the optoelectronic semiconductor chip is embedded into the mold compound, wherein the bottom side of the optoelectronic semiconductor chip remains at least partially not covered by the mold compound. The carrier is removed. Advantageously, an assembly process according to the method for producing the optoelectronic device comprises a few simple steps requiring only little equipment investment.

In an embodiment a wavelength-converting material is arranged above the surface of the carrier before arranging the optoelectronic semiconductor chip. The wavelength-converting material is perforated during forming the recess. Advantageously, this method allows the production of optoelectronic devices being able to generate electromagnetic radiation of a desired colour.

In an embodiment the optoelectronic semiconductor chip is pressed into the wavelength-converting material. The bottom side of the optoelectronic semiconductor chip remains at least partially not covered by the wavelength-converting material. Advantageously, pressing the optoelectronic semiconductor chip into the wavelength-converting material allows determining a press-in amount of the optoelectronic semiconductor chip. Thus, it is possible to keep the bottom side of the optoelectronic semiconductor chip at least partially free from the wavelength-converting material. This can be necessary as the optoelectronic semiconductor might comprise electrical contact pads at its bottom side for providing electrical energy for an operation of the optoelectronic semiconductor chip. Therefor the electrical contact pads have to be not covered by the wavelength-converting material.

In an embodiment forming the recess is performed by bevel cutting, etching or laser ablation. Advantageously, bevel cutting is a simple process. Etching can e.g., be performed by gas-assisted etching, e.g., a focused ion-beam technique (FIB). An advantage of gas-assisted etching and laser ablation consists in that impurities can be omitted in contrast to bevel cutting.

In an embodiment the mold compound is arranged by means of molding, in particular by film-assisted transfer molding. Advantageously, film-assisted transfer molding allows ensuring the bottom side of the optoelectronic semiconductor chip remains at least partially not covered by the mold compound. In particular, electrical contact pads arranged at the bottom side of the optoelectronic semiconductor chip can be not covered by the mold compound.

In an embodiment a plurality of optoelectronic semiconductor chips is embedded into the mold compound. Each optoelectronic semiconductor chip is surrounded by a respective recess. Advantageously, a plurality of optoelectronic devices can be produced.

In an embodiment the following step is performed after removing the carrier: The mold compound is cut. Cutting is performed in regions of elevations formed by the mold compound which has been arranged in the recess. Advantageously, individual optoelectronic devices can be obtained by cutting the mold compound.

An optoelectronic device comprises an optoelectronic semiconductor chip and a mold compound. The mold compound forms walls enclosing a cavity. The optoelectronic semiconductor chip is embedded into the mold compound such that a top side of the optoelectronic semiconductor chip is not covered by the mold compound and a bottom side of the optoelectronic semiconductor chip is at least partially not covered by the mold compound. The optoelectronic semiconductor chip is arranged in the cavity such that the walls of the cavity protrude above the top side of the optoelectronic semiconductor chip in a direction averted from the bottom side of the optoelectronic semiconductor chip. Advantageously, the mold compound forms a chip-scale package while simultaneously being a reflector.

In an embodiment the optoelectronic semiconductor chip is embedded into a wavelength-converting material such that side faces of the optoelectronic semiconductor chip are at least partially covered by the wavelength-converting material. The bottom side of the optoelectronic semiconductor chip is at least partially not covered by the wavelength-converting material. A top side of the wavelength-converting material formed above the top side of the optoelectronic semiconductor chip is not covered by the mold compound. Advantageously, the wavelength-converting material is intended to convert a wavelength of electromagnetic radiation emitted by the optoelectronic semiconductor chip during operation.

In an embodiment the mold compound comprises reflective particles. Advantageously, electromagnetic radiation emitted by the optoelectronic semiconductor chip can be reflected at the particles embedded in the mold compound. Thus, the walls of the cavity serve as a reflector.

In an embodiment the optoelectronic device comprises a further mold compound arranged in the cavity. Advantageously, the further mold compound can protect the optoelectronic semiconductor chip from moisture, other impurities and mechanical strain.

In an embodiment the further mold compound forms an optical element above the walls. Advantageously, the optical element can e.g., be a lens e.g., focussing electromagnetic radiation emitted by the optoelectronic semiconductor chip during operation.

In an embodiment the optoelectronic semiconductor chip comprises two electrical contact pads arranged at its bottom side. The electrical contact pads are not covered by the mold compound and the wavelength-converting material. Advantageously, the optoelectronic semiconductor chip can be provided with electrical power for operation. Contacting the optoelectronic semiconductor chip with a bonding wire is also not necessary.

BRIEF DESCRIPTION OF THE DRAWINGS

The above-described properties, features and advantages of this invention and the way in which they are achieved will become clearer and more clearly understood in association with the following description of the exemplary embodiments explained in greater detail in association with the drawings. Here, in each case in schematic illustration.

DETAILED DESCRIPTION OF ILLUSTRATIVE EMBODIMENTS

Figure 4:
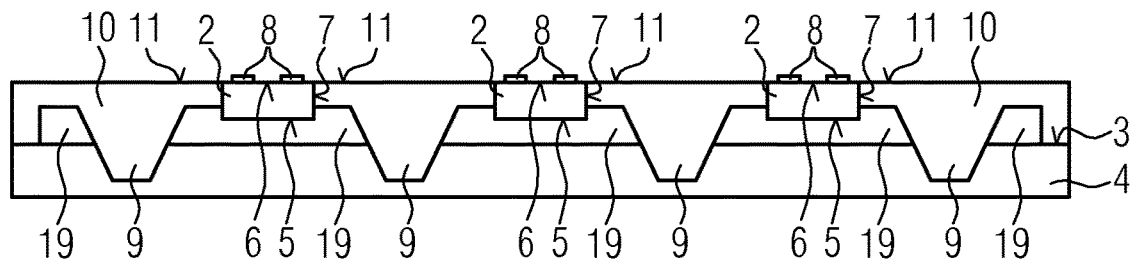
FIG. 4: shows a cross sectional side view of a mold compound arranged in the recess and above the surface of the carrier.
Figure 5:
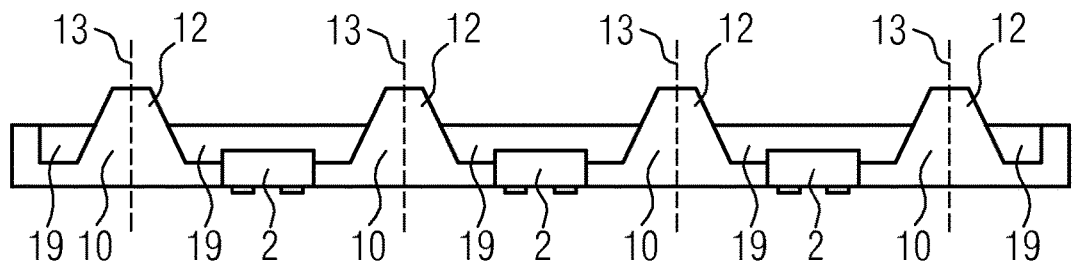
FIG. 5: shows a cross sectional side view of the optoelectronic semiconductor chips embedded into the mold compound.
Figure 6:
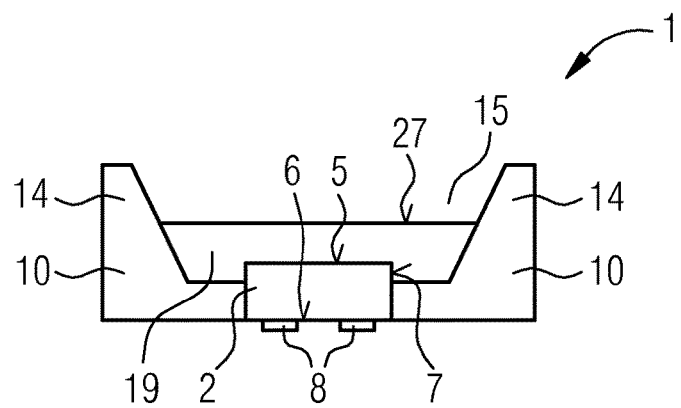
FIG. 6: shows a cross sectional side view of an optoelectronic device according to a first embodiment.

A method for producing an optoelectronic device 1 according to a first embodiment is schematically shown in FIG. 1 to 5, while FIG. 6 shows a schematic representation of the optoelectronic device 1. In each case, cross-sectional side views of the drawn elements are shown.

Figure 1:
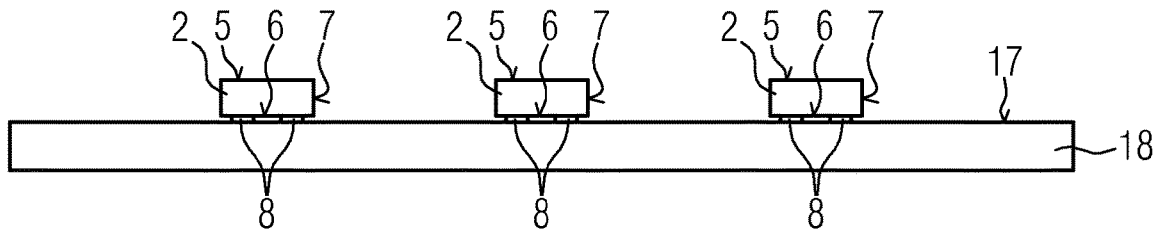
FIG. 1: shows a cross sectional side view of optoelectronic semiconductor chips arranged above a surface of a plate.

FIG. 1 shows a first step of the method for producing the optoelectronic device 1 schematically.

Optoelectronic semiconductor chips 2 have been arranged above a surface 17 of a plate 18. The plate 18 can comprise any material, e.g., a metal. The optoelectronic semiconductor chips 2 comprise top sides 5, bottom sides 6 and side faces 7. The optoelectronic semiconductor chips 2 have been arranged with their bottom sides 6 at the surface 17 of the plate 18. In order to fixate the optoelectronic semiconductor chips 2 at the surface 17, e.g., an adhesive tape can be used. FIG. 1 shows three optoelectronic semiconductor chips 2 arranged at the surface 17 of the plate 18. However, any number of optoelectronic semiconductor chips 2 can be arranged at the surface 17 of the plate 18.

The optoelectronic semiconductor chips 2 are able to emit electromagnetic radiation. For example, the optoelectronic semiconductor chips 2 can be light-emitting diodes (LED). Each of the optoelectronic semiconductor chips 2 comprises a sequence of semiconductor layers arranged on a substrate. The substrate and the sequence of semiconductor layers are not shown in FIG. 1 for the sake of simplicity. The substrate can, e.g., be a sapphire substrate. The substrate can also comprise other materials which can be insulators, metals, semiconductors and oxides thereof. The optoelectronic semiconductor chips 2 may be surface emitting diodes or volume emitting diodes.

Each optoelectronic semiconductor chip 2 comprises two electrical contact pads 8 arranged at the bottom side 6. The electrical contact pads 8 comprise a metal, e.g., copper. The electrical contact pads 8 are intended to provide electrical power for operating the optoelectronic semiconductor chips 2. The optoelectronic semiconductor chips 2 may be flip chips.

Figure 2:
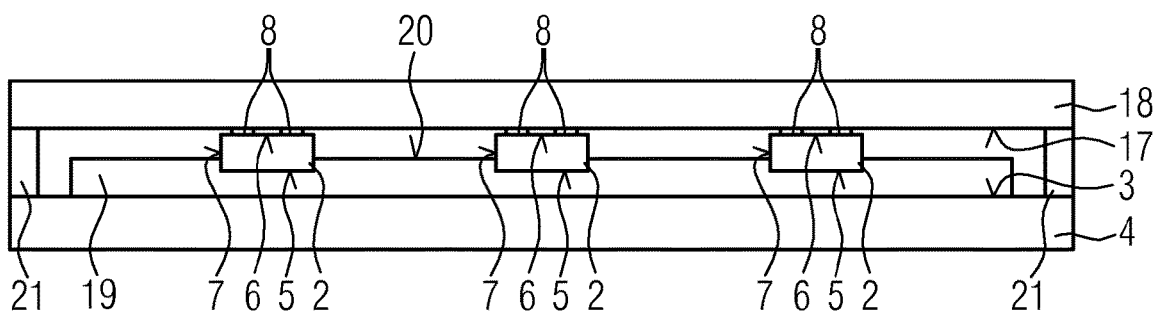
FIG. 2: shows a cross sectional side view of the optoelectronic semiconductor chips pressed into a wavelength-converting material provided on a carrier.

FIG. 2 schematically shows a temporally subsequent processing state with respect to FIG. 1.

A wavelength-converting material 19 arranged above a surface 3 of a carrier 4 has been provided. The carrier 4 can comprise any material, e.g., a metal. The optoelectronic semiconductor chips 2 have been pressed into the wavelength-converting material 19. The wavelength-converting material 19 e.g., comprises a resin, e.g., a silicone or an epoxy. The resin is blended with wavelength-converting particles. The wavelength-converting particles can, e.g., comprise yttrium aluminium garnet (YAG) doped with $Ce^{3+}$-ions. The wavelength-converting particles can also be called a phosphor. The wavelength-converting material 19 can be provided as a sheet which also can be called phosphor sheet. The phosphor sheet can be fixated with an adhesive tape at the carrier 4. In order to enable pressing of the optoelectronic semiconductor chips 2 into the phosphor sheet, the phosphor sheet should be provided in an uncured state. An uncured phosphor sheet is typically called an A-stage phosphor sheet.

The wavelength-converting material 19 is intended to convert a wavelength of electromagnetic radiation emitted by the optoelectronic semiconductor chips 2 during operation. Due to a certain cross-section of conversion, only a part of the emitted electromagnetic radiation is converted. In sum, a mixture of the emitted and the converted electromagnetic radiation is radiated. For example, the wavelength-converting material 19 can be intended for converting blue light into yellow light. In sum, white light can be generated.

The optoelectronic semiconductor chips 2 have been pressed into the wavelength-converting material 19 by arranging the plate 18 such that the top sides 5 of the optoelectronic semiconductor chips 2 initially are in contact with a surface 20 of the wavelength-converting material 19. By applying pressure to the plate 18, the optoelectronic semiconductor chips 2 can be pressed into the wavelength-converting material 19. Alternatively, the plate 18 could comprise a mass which is sufficient to press the optoelectronic semiconductor chips 2 into the wavelength-converting material 19. The wavelength-converting material 19 may be heated during the pressing-process. Thus, the wavelength-converting material 19 becomes soft or it partially melts when heating is performed at or beyond a melting point of the wavelength-converting material 19.

As shown in FIG. 2, the optoelectronic semiconductor chips 2 have been pressed only partially into the wavelength-converting material 19. However, it is also possible to press the optoelectronic semiconductor chips 2 into the wavelength-converting material 19 such that the surface 20 of the wavelength-converting material 19 is flush with the bottom sides 6 of the optoelectronic semiconductor chips 2. The bottom sides 6 have to remain at least partially free from the wavelength-converting material 19. At least the electrical contact pads 8 have to remain not covered by the wavelength-converting material 19. A spacer 21 can be used to determine a press-in amount of the optoelectronic semiconductor chips 2 as shown in FIG. 2.

After pressing the optoelectronic semiconductor chips 2 into the wavelength-converting material 19, the wavelength-converting material 19 can be cured. Curing may be performed thermally or by UV-light exposure.

Figure 3:
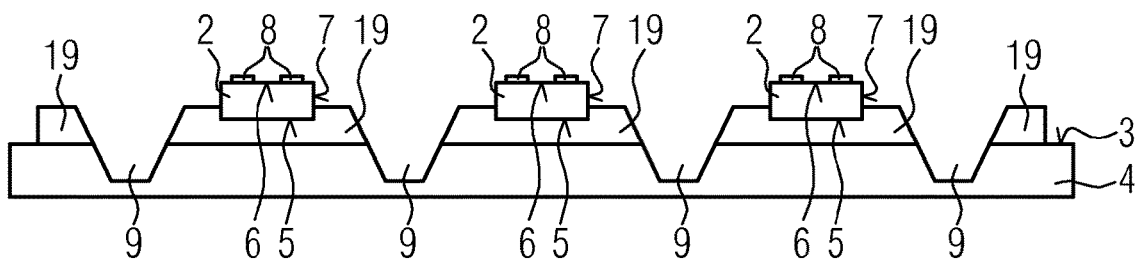
FIG. 3: shows a cross sectional side view of a recess formed at the surface of the carrier surrounding each optoelectronic semiconductor chips respectively.

FIG. 3 schematically shows a temporally subsequent processing state with respect to FIG. 2.

The plate 18 has been removed. A recess 9 has been formed at the surface 3 of the carrier 4. The recess 9 surrounds each optoelectronic semiconductor chip 2, respectively. The recess 9 can e.g., be formed by bevel cutting, etching or laser ablation. The wavelength-converting material 19 is perforated in regions of the recess 9 during forming the recess 9.

Etching can be performed by gas-assisted etching, e.g., by a focused ion-beam technique (FIB). Laser ablation is a technique to remove material at a surface, wherein the surface is illuminated with high intensity laser-radiation. Typically, a pulsed illumination is performed. The illuminated material is converted into a plasma upon illumination.

FIG. 4 schematically shows a temporally subsequent processing state with respect to FIG. 3.

A mold compound 10 has been arranged in the recess 9 and above the surface 3 of the carrier 4. The mold compound 10 may comprise a resin, e.g., a silicone, an epoxy or a polyphthalamide. The optoelectronic semiconductor chips 2 are embedded in the mold compound 10. The mold compound 10 has been arranged such that the bottom sides 6 of the optoelectronic semiconductor chips 2 are not covered by the mold compound 10. At least, the electrical contact pads 8 have to be exposed and not covered by the mold compound 10.

In order to arrange the mold compound 10 such that the bottom sides 6 of the optoelectronic semiconductor chips 2 are not covered by the mold compound 10, e.g., film assisted transfer molding can be used. In this process, a forming tool is used which encloses a cavern. Inner walls of the cavern may be laminated with a foil comprising, e.g., teflon. The carrier 4 and the optoelectronic semiconductor chips 2 are arranged in the cavern such that the bottom sides 6 are in direct contact with an inner wall of the cavern laminated with the foil. By arranging the mold compound 10 in the cavern, the bottom sides 6 of the optoelectronic semiconductor chips 2 remain free from the mold compound 10.

Alternatively, apart from film-assisted transfer molding, other molding techniques may be used. In this case, the bottom sides 6 of the optoelectronic semiconductor chips 2 may be covered with the mold compound 10 initially. Afterwards, parts the mold compound 10 can be removed, e.g., by grinding, until the electrical contact pads 8 are exposed.

FIG. 5 schematically shows a temporally subsequent processing state with respect to FIG. 4.

The mold compound 10 may have been cured. The carrier 4 has been removed. Portions of the mold compound 10 which have been arranged in the recess 9 remain as elevations 12. As shown in FIG. 5, the elevations 12 comprise a conical shape. This results from a geometry of the recess 9. If the geometry of the recess 9 is conically shaped, the elevations 12 will be shaped conically, as well.

In a next step, the mold compound 10 is cut in regions of the elevations 12. The mold compound 10 is cut along cutting planes 13 indicated as dashed lines 13 in FIG. 5. Any suitable means can be used to cut the mold compound 10. Thus, individual optoelectronic devices 1 are produced.

FIG. 6 schematically shows a cross sectional side view of the optoelectronic device 1 according to the first embodiment.

The mold compound 10 forms walls 14 enclosing a cavity 15. The optoelectronic semiconductor chip 2 and the wavelength-converting material 19 are embedded into the mold compound 10 such that a top side 27 of the wavelength-converting material 19 is not covered by the mold compound 10 and the bottom side 6 of the optoelectronic semiconductor chip 2 is not covered by the mold compound 10. The optoelectronic semiconductor chip 2 is arranged in the cavity 15 such that the walls 14 of the cavity 15 protrude above the top side 5 of the optoelectronic semiconductor chip 2 in a direction averted from the bottom side 6 of the optoelectronic semiconductor chip 2. The mold compound 10 forms a chip-scale package. Only the mold compound 10 carries the optoelectronic semiconductor chip 2. There are no further structural carriers or supporting elements. At the same time, the mold compound 10 forms a conically shaped reflector.

The mold compound 10 may comprise reflective particles. The reflective particle can, e.g., comprise a silicon-oxide or a titanium-oxide.

Electromagnetic radiation emitted by the optoelectronic semiconductor chip 2 is radiated into a solid angle depending on a height of the walls 14. Increasing the height of the walls 14 by increasing a depth of the recess 9 leads to a decreased solid angle.

The wavelength-converting material 19 covers the top side 5 and parts of the side faces 7 of the optoelectronic semiconductor chip 2. In the case of a volume emitting optoelectronic semiconductor chips 2, this is expedient. However, this is not absolutely necessary. If the optoelectronic semiconductor chip 2 is a surface emitter, it will be sufficient to cover only the top side 5 of the optoelectronic semiconductor chip 2 by the wavelength-converting material 19. This can be realised by skipping the pressing process. Instead, the optoelectronic semiconductor chips 2 can just be arranged such the top sides 5 are in direct contact with the surface 20 of the wavelength-converting material 19.

As shown in FIG. 6, the side faces 7 of optoelectronic semiconductor chip 2 are only partially embedded into the wavelength-converting material 19. However, it is also possible to embed the optoelectronic semiconductor chip 2 such that the side faces 7 are completely covered by the wavelength-converting material 19. The side faces 7 at least have to be partially embedded into the wavelength-converting material 19. In the case shown in FIG. 6, two different materials are in direct contact with the side faces 7 of the optoelectronic semiconductor chip 2 which can provide a more robust optoelectronic device 1 in comparison to the case where only one material is in direct contact with the side faces 7. The bottom side 6 has to remain at least partially free from the wavelength-converting material 19.

Figure 9:
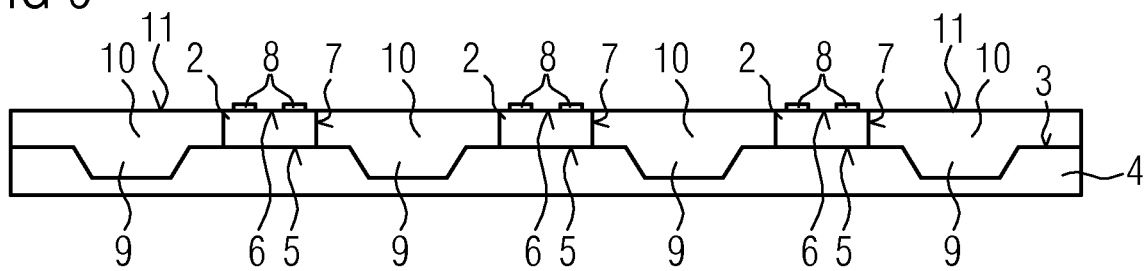
FIG. 9: shows a cross sectional side view of a mold compound arranged in the recess and above the surface of the carrier.
Figure 10:
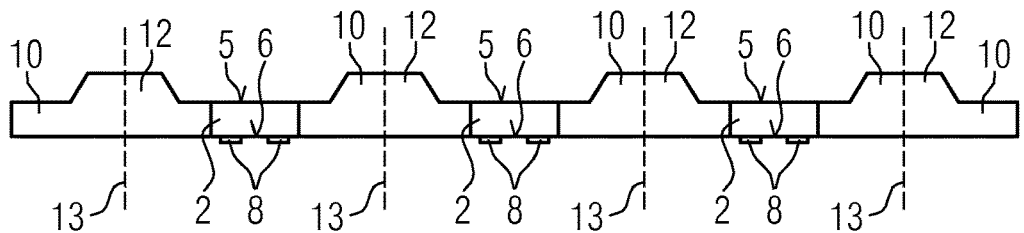
FIG. 10: shows a cross sectional side view of the optoelectronic semiconductor chips embedded into the mold compound.
Figure 11:
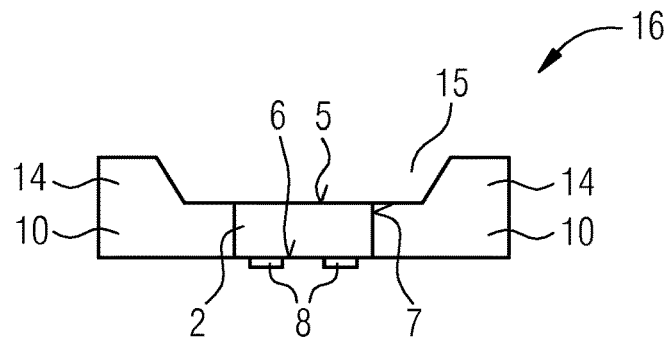
FIG. 11: shows a cross sectional side view of an optoelectronic device according to a second embodiment.

A method for producing an optoelectronic device 16 according to a second embodiment is schematically shown in FIG. 7 to 10, while FIG. 11 shows a scheme of the optoelectronic device 1. In each case, cross-sectional side views of the drawn elements are shown. The optoelectronic device 16 according to the second embodiment comprises similarities to the optoelectronic device 1 according to the first embodiment. Identical elements are marked with the same reference numerals. In the following description, only differences are explained.

Figure 7:
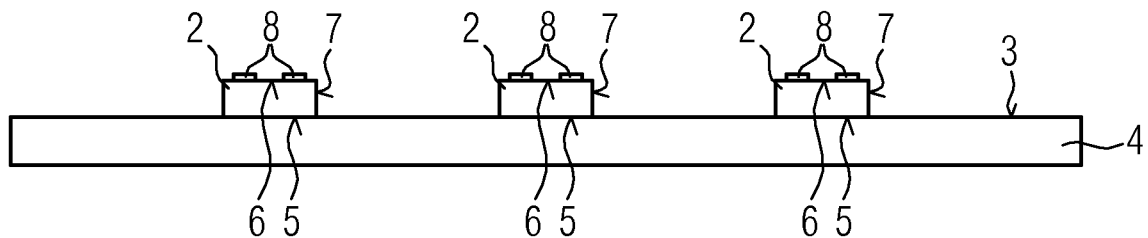
FIG. 7: shows a cross sectional side view of optoelectronic semiconductor chips arranged above a surface of a carrier.

FIG. 7 shows a first step of the method for producing the optoelectronic device 16 schematically.

The optoelectronic semiconductor chips 2 have been arranged above the surface 3 of the carrier 4. The optoelectronic semiconductor chips 2 have been arranged with their top sides 5 at the surface 3 of the carrier 4.

Figure 8:
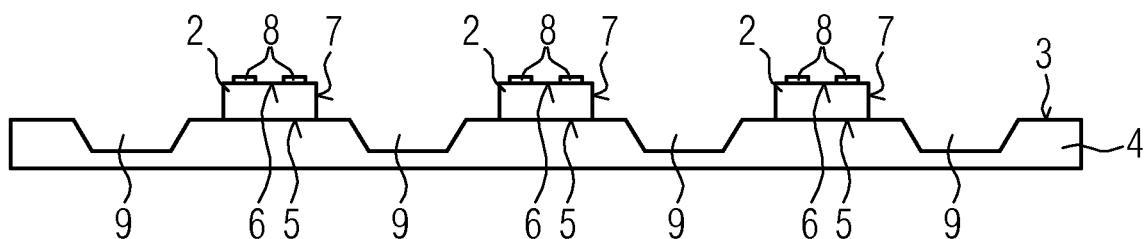
FIG. 8: shows a cross sectional side view of a recess formed at the surface of the carrier surrounding each optoelectronic semiconductor chip respectively.

FIG. 8 schematically shows a temporally subsequent processing state with respect to FIG. 7.

The recess 9 has been formed at the surface 3 of the carrier 4. The recess 9 surrounds each optoelectronic semiconductor chip 2, respectively.

FIG. 9 schematically shows a temporally subsequent processing state with respect to FIG. 8.

The mold compound 10 has been arranged in the recess 9 and above the surface 3 of the carrier 4. The optoelectronic semiconductor chips 2 are embedded in the mold compound 10. The mold compound 10 has been arranged such that the bottom sides 6 of the optoelectronic semiconductor chips 10 are not covered by the mold compound 10. The bottom sides 6 of the optoelectronic semiconductor chips 2 have at least partially to be not covered by the mold compound 10. At least the electrical contact pads 8 have to be exposed and not covered by the mold compound 10.

FIG. 10 schematically shows a temporally subsequent processing state with respect to FIG. 9.

The mold compound 10 has been cured. The carrier 4 has been removed. Portions of the mold compound 10 which have been arranged in the recess 9 remain as elevations 12.

In a next step, the mold compound 10 is cut in regions of the elevations 12. Cutting the mold compound 10 is performed along cutting planes 13 indicated by cutting lines 13 shown as dashed lines in FIG. 10. Thus, individual optoelectronic devices 1 are produced.

FIG. 11 schematically shows a cross sectional side view of the optoelectronic device 16 according to the second embodiment.

The mold compound 10 forms walls 14 enclosing a cavity 15. The optoelectronic semiconductor chip 2 is embedded into the mold compound 10 such that the top side 5 of the optoelectronic semiconductor chip 2 is not covered by the mold compound 10 and the bottom side 6 of the optoelectronic semiconductor chip 2 is not covered by the mold compound 10. The optoelectronic semiconductor chip 2 is arranged in the cavity 15 such that the walls 14 of the cavity 15 protrude above the top side 5 of the optoelectronic semiconductor chip 2 in a direction averted from the bottom side 6 of the optoelectronic semiconductor chip 2. The mold compound 10 forms a chip-scale package. Only the mold compound 10 carries the optoelectronic semiconductor chip 2. There are no further structural carriers or supporting elements. At the same time, the mold compound 10 forms a conically shaped reflector.

Figure 12:
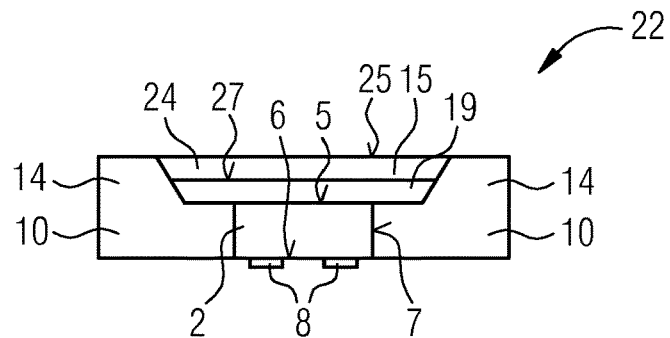
FIG. 12: shows a cross sectional side view of an optoelectronic device according to a third embodiment.

FIG. 12 schematically shows a cross sectional side view of an optoelectronic device 22 according to a third embodiment. The optoelectronic device 22 according to the third embodiment can be produced by using the optoelectronic devices 1, 16 according to the first and second embodiments. Exemplary, FIG. 12 shows the case wherein the optoelectronic device 1 according to the first embodiment has been used.

A further mold compound 24 has been arranged in the cavity 15. The further mold compound 24 may comprise a resin, e.g., a silicone or an epoxy. The further mold compound 24 may be transparent. The further mold compound 24 can e.g., be arranged by a dosing method in the cavity 15. The further mold compound 24 comprises a flat surface 25.

Figure 13:
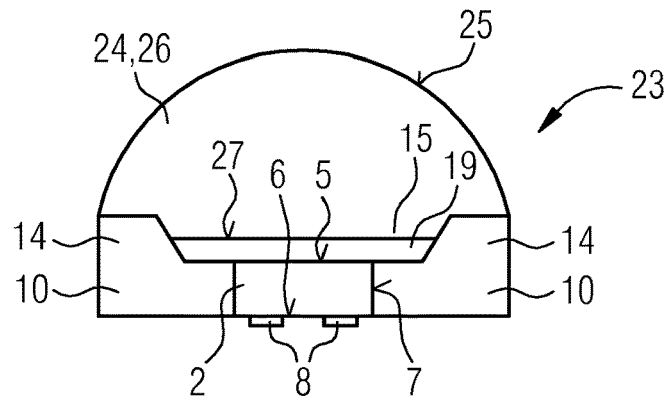
FIG. 13: shows a cross sectional side view of an optoelectronic device according to a fourth embodiment.

FIG. 13 schematically shows a cross sectional side view of an optoelectronic device 23 according to a fourth embodiment. The optoelectronic device 23 according to the fourth embodiment can be produced by using the optoelectronic devices 1, 16 according to the first and second embodiments. Exemplary, FIG. 13 shows the case wherein the optoelectronic device 1 according to the first embodiment has been used.

In this case, the further mold compound 24 comprises a curved surface 25. The further mold compound 24 forms an optical element 26. In FIG. 13 the optical element 26 is a convex lens. This is not absolutely necessary. The optical element 26 can also be formed as a concave lens.

The invention has been illustrated and described in more specific detail on the basis of the preferred exemplary embodiments. Nevertheless, the invention is not restricted to the examples disclosed. Rather, other variations can be derived therefrom by the person skilled in the art, without departing from the scope of protection of the invention.

The invention claimed is:

1. A method for producing an optoelectronic device, the method comprising:
   providing an optoelectronic semiconductor chip comprising a top side and a bottom side;
   arranging the optoelectronic semiconductor chip with its top side towards a surface of a carrier;
   forming a recess at the surface of the carrier such that the recess surrounds the optoelectronic semiconductor chip;
   arranging a mold compound in the recess and above the surface of the carrier such that the optoelectronic semiconductor chip is embedded into the mold compound, wherein the bottom side of the optoelectronic semiconductor chip remains at least partially not covered by the mold compound, and wherein portions of the mold compound, which have been arranged in the recess, remain as elevations after removing the carrier; and
   arranging a wavelength-converting material above the surface of the carrier before arranging the optoelectronic semiconductor chip, wherein the wavelength-converting material is perforated while forming the recess.

2. The method as claimed in claim 1, further comprising pressing the optoelectronic semiconductor chip into the wavelength-converting material, wherein the bottom side of the optoelectronic semiconductor chip remains at least partially not covered by the wavelength-converting material.

3. The method as claimed in claim 1, wherein forming the recess comprises forming the recess by bevel cutting, etching or laser ablation.

4. The method as claimed in claim 1, wherein arranging the mold compound comprises molding.

5. The method as claimed in claim 4, wherein molding comprises film-assisted transfer molding.

6. The method as claimed in claim 1, wherein a plurality of optoelectronic semiconductor chips is embedded into the mold compound, and wherein each optoelectronic semiconductor chip is surrounded by a respective recess.

7. The method as claimed in claim 6, further comprising cutting the mold compound after removing the carrier, wherein cutting comprises cutting in regions of the elevations.

8. A method for producing an optoelectronic device, the method comprising:

providing an optoelectronic semiconductor chip comprising a top side and a bottom side;

arranging the optoelectronic semiconductor chip with its top side towards a surface of a carrier;

forming a recess at the surface of the carrier such that the recess surrounds the optoelectronic semiconductor chip;

arranging a mold compound in the recess and above the surface of the carrier such that the optoelectronic semiconductor chip is embedded into the mold compound, wherein the bottom side of the optoelectronic semiconductor chip remains at least partially not covered by the mold compound;

removing the carrier;

arranging a wavelength-converting material above the surface of the carrier before arranging the optoelectronic semiconductor chip, wherein the wavelength-converting material is perforated while forming the recess; and cutting the mold compound after removing the carrier, wherein cutting comprises cutting in regions of elevations formed by the mold compound arranged in the recess.

* * * * *